US009397025B2

(12) United States Patent
Meghro et al.

(10) Patent No.: US 9,397,025 B2
(45) Date of Patent: Jul. 19, 2016

(54) SEMICONDUCTOR DEVICE AND METHOD FOR MANUFACTURING THEREOF

(71) Applicant: CYPRESS SEMICONDUCTOR CORPORATION, San Jose, CA (US)

(72) Inventors: Kouichi Meghro, Kanagawa (JP); Junichi Kasai, Kanagawa (JP)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 13/725,637

(22) Filed: Dec. 21, 2012

(65) Prior Publication Data

US 2014/0077347 A1 Mar. 20, 2014

Related U.S. Application Data

(63) Continuation of application No. 12/259,100, filed on Oct. 27, 2008, now Pat. No. 8,421,241.

(30) Foreign Application Priority Data

Oct. 25, 2007 (JP) ................................. 2007-277998

(51) Int. Cl.
*H01L 23/495* (2006.01)
*H01L 23/00* (2006.01)
(Continued)

(52) U.S. Cl.
CPC .............. *H01L 23/495* (2013.01); *H01L 21/50* (2013.01); *H01L 23/49517* (2013.01); *H01L 23/49548* (2013.01); *H01L 24/97* (2013.01); *H01L 25/105* (2013.01); *H01L 24/48* (2013.01); *H01L 24/49* (2013.01); *H01L 2224/32145* (2013.01); *H01L 2224/32245* (2013.01); *H01L 2224/48227* (2013.01); *H01L 2224/48247* (2013.01); *H01L 2224/48465* (2013.01); *H01L 2224/49171* (2013.01); *H01L 2224/73265* (2013.01); *H01L 2224/97* (2013.01); *H01L 2225/1029* (2013.01); *H01L 2924/01005* (2013.01); *H01L 2924/01006* (2013.01); *H01L 2924/01013* (2013.01);
(Continued)

(58) Field of Classification Search
None
See application file for complete search history.

(56) References Cited

U.S. PATENT DOCUMENTS 4,890,152 A * 12/1989 Hirata et al. .................. 257/666
5,144,412 A 9/1992 Chang et al.
(Continued)

FOREIGN PATENT DOCUMENTS

JP 01191455 8/1989
JP 01196153 8/1989
(Continued)

OTHER PUBLICATIONS

USPTO Final Rejection for U.S. Appl. No. 12/259,100 dated May 5, 2011; 12 pages.
(Continued)

*Primary Examiner* — Andres Munoz

(57) ABSTRACT

The present invention provides a semiconductor device including: a semiconductor chip; a lead frame provided with a recessed portion on at least one of an upper surface or a lower surface thereof, and electrically coupled to the semiconductor chip; and a resin section that molds the semiconductor chip and the lead frame, and is provided with an opening above the recessed portion. By inserting a conductive pin (not shown) into the recessed portion through the opening, a plurality of semiconductor devices can be mechanically and electrically coupled to each other.

10 Claims, 17 Drawing Sheets

(51) Int. Cl.
*H01L 25/10* (2006.01)
*H01L 21/50* (2006.01)

(52) U.S. Cl.
CPC .............. *H01L2924/01029* (2013.01); *H01L 2924/01033* (2013.01); *H01L 2924/01047* (2013.01); *H01L 2924/01079* (2013.01); *H01L 2924/01082* (2013.01); *H01L 2924/15311* (2013.01); *H01L 2924/181* (2013.01); *H01L 2924/3511* (2013.01)

(56) References Cited

U.S. PATENT DOCUMENTS

| | | | | |
|---|---|---|---|---|
| 5,378,924 | A | * | 1/1995 | Liang .............................. 257/675 |
| 5,442,234 | A | * | 8/1995 | Liang .............................. 257/675 |
| 5,596,224 | A | * | 1/1997 | Murphy et al. ................. 257/666 |
| 5,608,265 | A | | 3/1997 | Kitano et al. |
| 5,973,393 | A | | 10/1999 | Chia et al. |
| 6,297,543 | B1 | | 10/2001 | Hong et al. |
| 6,486,545 | B1 | | 11/2002 | Glenn et al. |
| 6,577,013 | B1 | | 6/2003 | Glenn et al. |
| 7,663,232 | B2 | | 2/2010 | Kensley |
| 7,728,420 | B2 | | 6/2010 | Cheah et al. |
| 2002/0042994 | A1 | | 4/2002 | Ito et al. |
| 2007/0145563 | A1 | | 6/2007 | Punzalan et al. |
| 2007/0262436 | A1 | | 11/2007 | Kweon et al. |
| 2008/0237829 | A1 | * | 10/2008 | Cheah et al. ................... 257/690 |

FOREIGN PATENT DOCUMENTS

| | | |
|---|---|---|
| JP | 03003374 | 1/1991 |
| JP | 10303358 | 11/1998 |

OTHER PUBLICATIONS

USPTO Final Rejection for U.S. Appl. No. 12/259,100 dated Jul. 13, 2010; 11 pages.
USPTO Final Rejection for U.S. Appl. No. 12/259,100 dated Jul. 17, 2012; 8 pages.
USPTO Final Rejection for U.S. Appl. No. 12/259,100 dated Oct. 31, 2011; 17 pages.
USPTO Non-Final Rejection for U.S. Appl. No. 12/259,100 dated Feb. 4, 2010; 10 pages.
USPTO Non-Final Rejection for U.S. Appl. No. 12/259,100 dated Apr. 10, 2012; 17 pages.
USPTO Non-Final Rejection for U.S. Appl. No. 12/259,100 dated Aug. 23, 2011; 16 pages.
USPTO Non-Final Rejection for U.S. Appl. No. 12/259,100 dated Dec. 21, 2010; 20 pages.
USPTO Notice of Allowance for U.S. Appl. No. 12/259,100 dated Oct. 9, 2012; 7 pages.

* cited by examiner 22 12 10 32 31    34 30 20

20 22 32 30  A-B-C-D-E-F  34 31    100
12 10                              36

SEMICONDUCTOR DEVICE AND METHOD FOR MANUFACTURING THEREOF

CROSS-REFERENCE TO RELATED APPLICATIONS

This application is a continuation of U.S. patent application Ser. No. 12/259,100, filed on Oct. 27, 2008, entitled "Semiconductor Device and Method for Manufacturing Thereof," which claims priority from Japanese patent application 2007-277998, filed on Oct. 25, 2007, which are hereby incorporated herein by reference in their entirety.

TECHNICAL FIELD

The present invention particularly relates to a semiconductor device for stacking a plurality of semiconductor devices and a method for manufacturing the same.

BACKGROUND ART

Recently, to meet the demand for electronic equipment which are both compactly sized and highly functional, a number of technologies for increasing the mounting density of semiconductor devices have been developed. Such technologies include a semiconductor device having a chip-on-chip structure and a semiconductor device having a package-on-package structure.

FIG. 20 of WO 99/56313 shows a semiconductor device in which a plurality of semiconductor packages are stacked by means of a solder ball provided on the tip of a through electrode provided on a lead frame. Published Japanese Translation of PCT Application No. JP-T-2000-510993 discloses a method for mounting electronic equipment on a wiring circuit body by using a clamping piece. Japanese Patent Application Publication No. JP-A-2003-151714 discloses a semiconductor device that electrically couples electronic equipment and wires to each other by using a connector pin.

However, increasing the mounting density of semiconductor devices remains an issue. For example, a semiconductor device having a chip-on-chip structure has a problem that chips are prone to breakage and chips which are stacked are unable to be isolated for repair or disposal, subsequently making it difficult to increase the yield in the mounting process.

Conversely, a semiconductor device having a package-on-package structure has a higher yield compared to the semiconductor device having a chip-on-chip structure, however packages are prone to be thermally deformed due to soldering when stacking, and, unfortunately stably stacking a plurality of semiconductor devices according to conventional techniques can be extremely difficult.

FIG. 1 is a cross-sectional view of a semiconductor device having a chip-on-chip structure according to a conventional example. On an upper surface of an interposer 84, a semiconductor chip 80 having an upper surface on which a circuit is formed is stacked via an adhesive 82. An external electrode (not shown) provided on the upper surface of the semiconductor chip 80 and a coupling terminal (not shown) on the interposer 84 are electrically coupled to each other by a wire 86. On a lower surface of the interposer 84, a solder ball 88 is provided for electrically coupling with the outside. On the upper surface of the interposer 84, a resin section 89 is provided that molds the semiconductor chip 80 and the wire 86.

According to such a structure, more than one such semiconductor chip 80 can be provided on one package, thereby potentially increasing the packaging density of the semiconductor devices.

A semiconductor device having the chip-on-chip structure described in FIG. 1 will have a plurality of semiconductor chips mounted on one semiconductor package. Accordingly, in a case where one of the semiconductor chips mounted is defective, non-defective semiconductor chips mounted together also need to be discarded. Therefore, increasing the yield in the mounting process is difficult, and can result in increasing costs. Furthermore, since the semiconductor chips need to be made smaller in order to increase the density, defectives are likely to be produced during manufacturing process.

FIG. 2 is a cross-sectional view of a semiconductor device having a package-on-package structure according to another conventional example. With respect to FIG. 1, identical structures have been assigned corresponding reference numerals and descriptions thereof shall be omitted. A first semiconductor package 90 and a second semiconductor package 92 each include the semiconductor chip 80, the adhesive 82, interposers 84a and 84b, the wire 86, and the resin section 89. A first solder ball 94 provided on a lower surface of the interposer 84a of the first semiconductor package 90 is bonded to an upper surface of the interposer 84b of the second semiconductor package 92. On a lower surface of the interposer 84b of the second semiconductor package 92, a second solder ball 96 for electrically coupling with the outside is provided. By employing such a structure, more than one such semiconductor package can be stacked vertically, whereby the mounting density of the semiconductor devices can be increased.

In a semiconductor device having the package-on-package structure of FIG. 2, a mechanical characteristic test and an electrical characteristic test are performed after packaging the semiconductor chip. Accordingly, only non-defective semiconductor packages are stacked. Further, the semiconductor chips are protected from external shock by the resin section. Accordingly, a semiconductor device having a package-on-package structure has higher yield in mounting process compared to a semiconductor device having a chip-on-chip structure. However, since the first semiconductor package 90 is mechanically and electrically coupled to the second semiconductor package 92 by melting and solidifying the first solder ball 94, the second semiconductor package 92 is deformed by the heat when melting the solder ball 94. Thus, the second semiconductor package 92 cannot be successfully joined to the first semiconductor package 90 in some cases. In the semiconductor device having a package-on-package structure, yield is susceptible to decrease due to thermal deformation as the number of the stacked semiconductor packages increases. Therefore, increasing the mounting density of the semiconductor devices is difficult.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

A semiconductor device according to a first aspect of the present invention includes: a semiconductor chip; a lead frame provided with a recessed portion on at least one of an upper surface or a lower surface thereof, and electrically coupled to the semiconductor chip; and a resin section that molds the semiconductor chip and the lead frame, and is provided with an opening above the recessed portion. According to this aspect of the present invention, by inserting the conductive pin into the recessed portion provided on the lead frame through the opening provided in the resin section, a plurality of semiconductor devices can be mechanically and electrically coupled to each other. Accordingly, a plurality of semiconductor devices can be stably stacked, whereby the mounting density of the semiconductor devices can be increased.

A semiconductor device according to another aspect of the present invention includes: a stack of a plurality of semiconductor devices; and a conductive pin that penetrates through the recessed portion provided on the lead frame and the opening provided in the resin section of each of the plurality of semiconductor devices, so as to electrically couple the plurality of semiconductor devices with each other. According to this aspect of the present invention, a plurality of semiconductor devices can be mechanically and electrically coupled to each other by the conductive pin. Accordingly, a plurality of semiconductor devices can be stably stacked, whereby the mounting density of the semiconductor devices can be increased.

A semiconductor device according to yet a further aspect of the present invention includes: an interposer mounted with the semiconductor device; an external coupling terminal provided on a surface of the interposer that is opposite to a surface on which the semiconductor device is mounted; and a redistribution layer electrically coupling the semiconductor device and the external coupling terminal to each other. According to this aspect of the present invention, the external coupling terminal can be provided in a position corresponding to a position of a coupling terminal of a mounting section on which the semiconductor device is mounted, whereby the semiconductor device can be mounted on any mounting section.

A method for manufacturing a semiconductor device according to a still further aspect of the present invention includes: forming a recessed portion on an upper surface or a lower surface of a lead frame; electrically coupling the lead frame and a semiconductor chip to each other; and forming a resin section that molds the lead frame and the semiconductor chip to form an opening above the recessed portion.

A method for manufacturing a semiconductor device according another aspect of the present invention includes: stacking a plurality of semiconductor devices; and mechanically and electrically coupling the plurality of semiconductor devices to each other by a conductive pin penetrating through the recessed portion provided on the lead frame and the opening provided in the resin section of each of the plurality of semiconductor devices.

According to some aspects of the present invention, by inserting the conductive pin into the recessed section provided on the lead frame through the opening provided in the resin section, a plurality of semiconductor devices can be mechanically and electrically coupled to each other. Accordingly, a plurality of semiconductor devices can be stacked stably, whereby the mounting density of the semiconductor devices can be increased.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention to these embodiments. On the contrary, the invention is intended to cover alternatives, modifications and equivalents, which may be included within the scope of the invention as construed according to the Claims.

Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

With reference to the accompanying drawings, embodiments of the present invention will be described below.

First Embodiment

Figure 1:
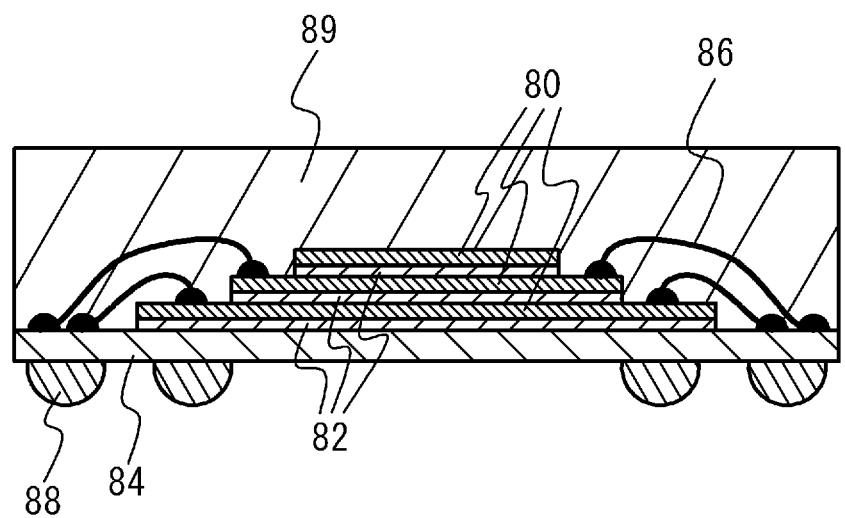
FIG. 1 is a cross-sectional view of a conventional semiconductor device.
Figure 2:
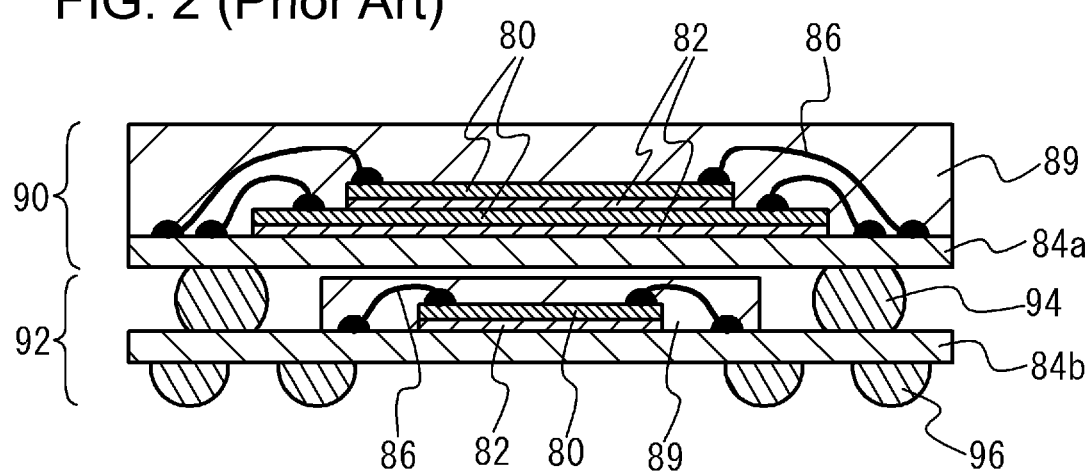
FIG. 2 is a cross-sectional view of an alternate conventional semiconductor device.
Figure 3A:
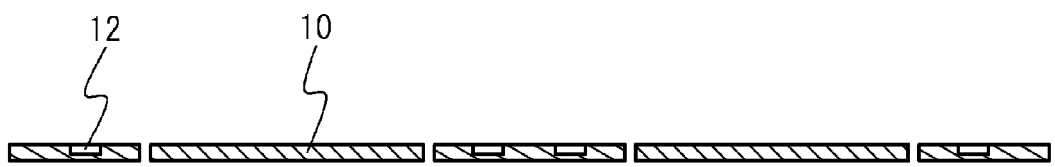
FIG. 3A depicts etching an upper surface of a lead frame in a method for manufacturing a semiconductor device according to a first embodiment of the present invention.

With reference to FIG. 3 to FIG. 5, a method for manufacturing a semiconductor device 100 according to a first embodiment of the present invention will be described. With reference to FIG. 3A, an upper surface of a lead frame 10 comprised of, for example, copper or stainless steel is half-etched to form a recessed portion 12. The thickness of the lead frame 10 is preferable to be 100 μm to 200 μm. After half-etching, the thickness of the lead frame 10 at the recessed portion 12 is preferable to be 50 μm or less.

Figure 3B:
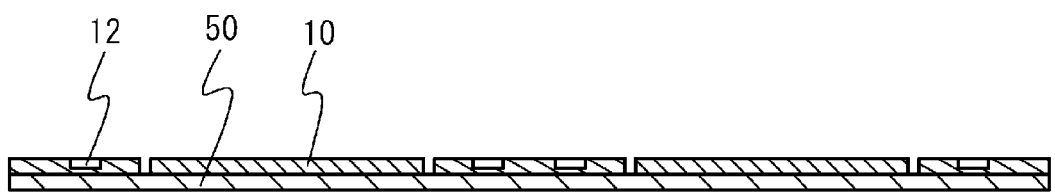
FIG. 3B depicts attaching an adhesive tape to a lead frame in a method for manufacturing a semiconductor device according to a first embodiment of the present invention.
Figure 3C:
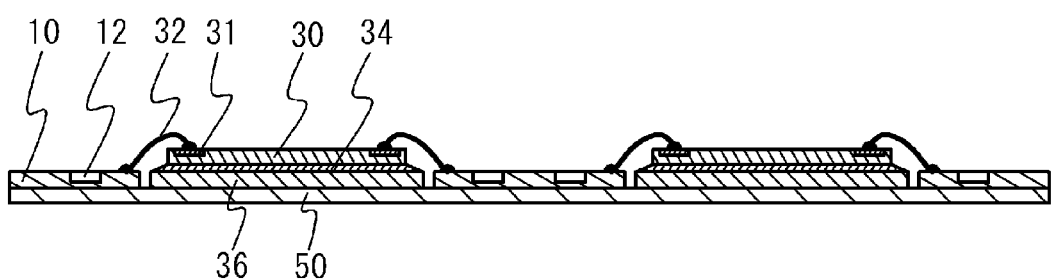
FIG. 3C depicts mounting a semiconductor chip in a method for manufacturing a semiconductor device according to a first embodiment of the present invention.

With reference to FIG. 3B, on a lower surface of the lead frame 10, a tape 50 with an adhesive for fixing the lead frame 10 is attached. A material of the tape 50 is preferable to be a polyimide-based resin with high thermal resistance, and the adhesive is preferable to be a silicon-based resin. With reference to FIG. 3C, a semiconductor chip 30 having an upper surface on which a circuit is formed is mounted, via an adhesive 34, on a base portion (metal plate 36) of the lead frame 10. The semiconductor chip 30 can be, for example, a logic chip or a memory chip. In one embodiment, the thickness of the semiconductor chip 30 is preferable to be 50 μm or more. Accordingly, due to the thickness, damage to the semiconductor chip 30 during a manufacturing process can be suppressed. Thereafter, an external electrode 31 of the semiconductor chip 30 and the lead frame 10 are electrically coupled to each other by a wire 32. In some embodiments, the wire 32 may be formed from gold or copper. In further embodiments, the diameter of the wire may be between 15 μm to 25 μm.

Figure 4A:
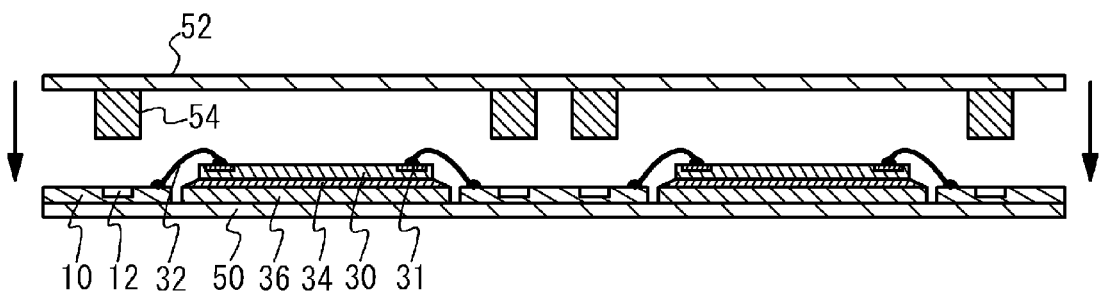
FIG. 4A depicts a mold used for resin molding in a method for manufacturing a semiconductor device according to a first embodiment of the present invention.
Figure 4B:
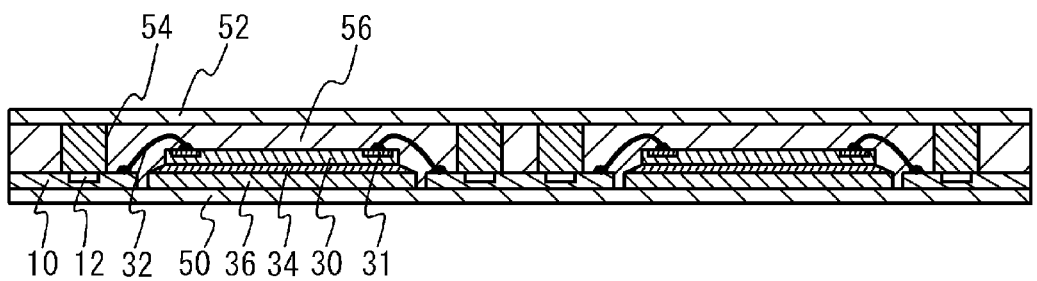
FIG. 4B shows a mold that holds a semiconductor chip and a lead frame according to one embodiment of the invention.
Figure 4C:
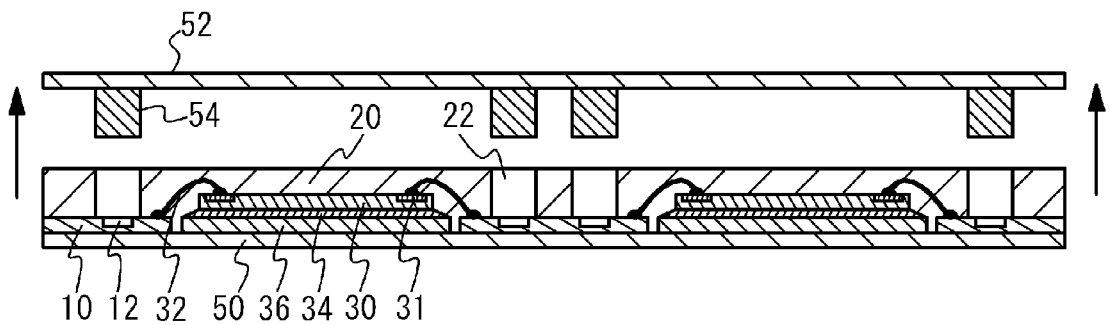
FIG. 4C depicts the forming of a resin section and a semiconductor chip in a method for manufacturing a semiconductor device according to a first embodiment of the present invention.

With reference to FIGS. 4A through 4C, by a method of transfer molding, the lead frame 10 and the semiconductor chip 30 are resin-molded. With reference to FIG. 4A, a mold 52 used for resin molding is provided with a clamp pin 54. The clamp pin 54 may be positioned, for example, above the recessed portion 12. When viewed from above, the area of the clamp pin 54 may be larger than the area of the recessed portion 12. With reference to FIG. 4B, the lead frame 10 and the semiconductor chip 30 are held by the mold 52, whereby a sealant 56 is filled in from a lateral direction (from the back of the drawing toward the front). At this time, since the clamp pin 54 completely covers an upper surface of the recessed portion 12, the sealant 56 is not filled in the recessed portion 12. For example, an epoxy-based resin of thermosetting type is used for the sealant 56. The sealant 56 is hardened by being heated for 120 seconds at a temperature of 175° C., for example. Thereafter, with reference to FIG. 4C, when the mold 52 is removed, the resin section 20 that molds the lead frame 10 and the semiconductor chip 30 is formed, and the opening 22 is formed above the recessed portion 12.

Figure 5A:
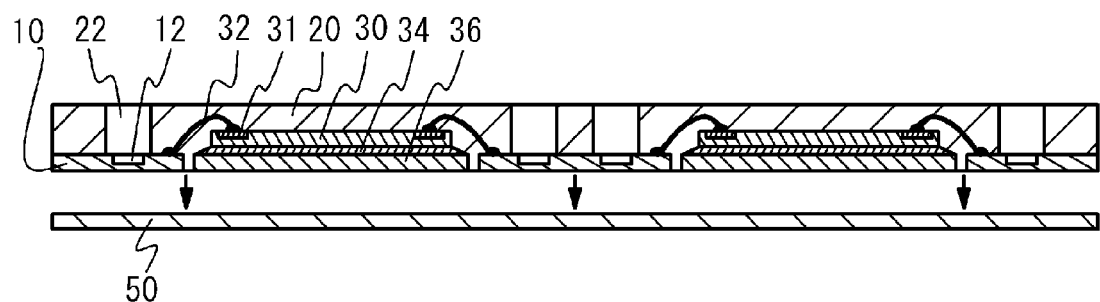
FIG. 5A depicts peeling off an adhesive tape in a method for manufacturing a semiconductor device according to a first embodiment of the present invention.
Figure 5B:
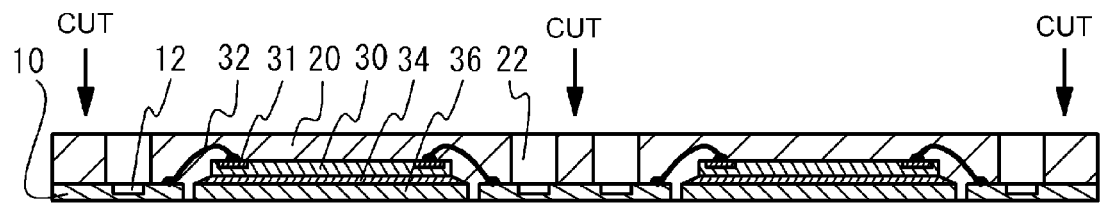
FIG. 5B depicts cutting a lead frame and resin section in a method for manufacturing a semiconductor device according to a first embodiment of the present invention.

With reference to FIG. 5A, an adhesive tape 50 is peeled off. With reference to FIG. 5B, the lead frame 10 and the resin section 20 are cut by, for example, a diamond grindstone (not shown). Consequently, the semiconductor device 100 (see FIG. 6) according to the first embodiment is completed.

Figure 6A:
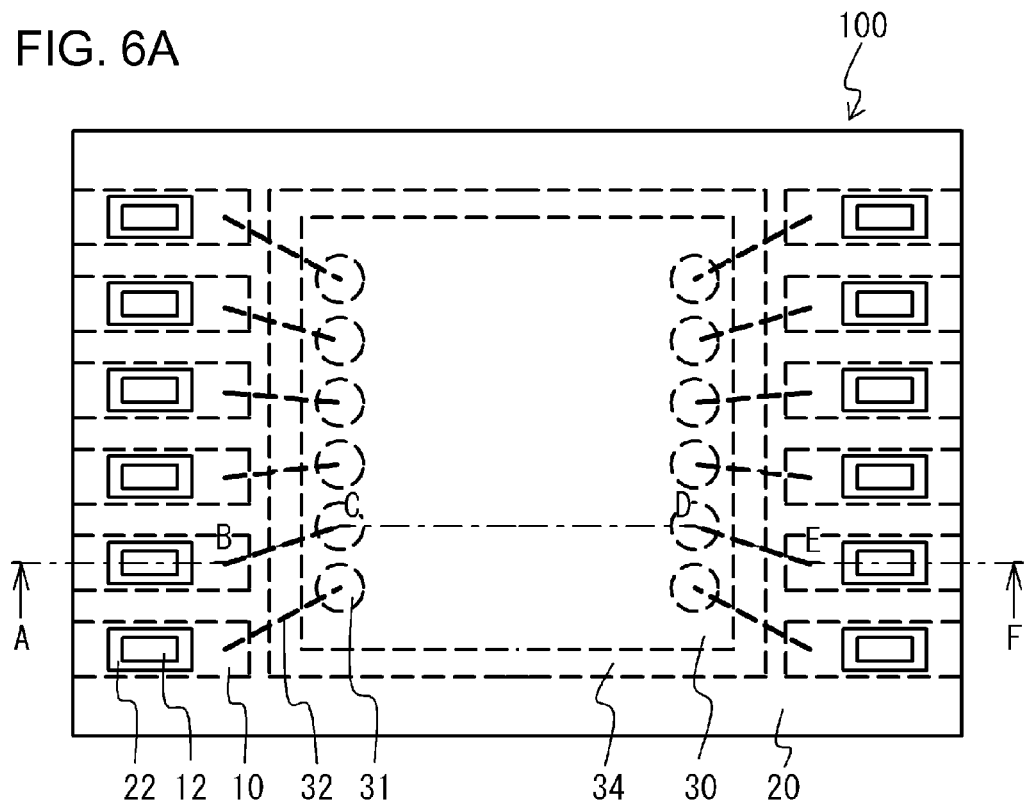
FIG. 6A is a top view of the semiconductor device according to the first embodiment.
Figure 6B:
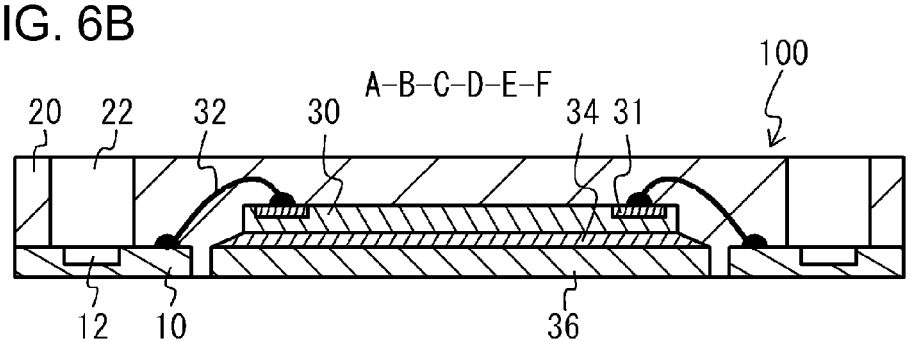
FIG. 6B is a cross-sectional view of a semiconductor device taken along the line A-F in FIG. 6A.

FIG. 6A is a top view of the semiconductor device 100 according to the first embodiment, FIG. 6B is a cross-sectional view taken along the line A-B-C-D-E-F of FIG. 6A. The semiconductor chip 30 is mounted on the metal plate 36 via the adhesive 34. The external electrode 31 is provided on the semiconductor chip 30. The external electrode 31 and the lead frame 10 are electrically coupled to each other by the wire 32. The recessed portion 12 is provided on the upper surface of the lead frame 10. The recessed portion 12 is a portion for inserting a conductive pin 60 (see FIG. 7) for electrically coupling the semiconductor device 100 with other semiconductor devices or an interposer. The lead frame 10 and the semiconductor chip 30 are molded with the resin section 20. On the resin section 20, the opening 22 is provided above the recessed portion 12. The recessed portion 12 is exposed to the outside through the opening 22. Accordingly, the conductive pin 60 can be directly inserted into the recessed portion 12 without contacting the resin section 20.

With reference to FIG. 6B, a lower surface of the semiconductor chip 30 is covered with an insulating resin 34 (adhesive 34). A lower surface of the insulating resin 34 is covered with the metal plate 36. A lower surface of the metal plate 36 remains uncovered by the resin section 20. The insulating resin 34 and the adhesive 34 are the same component, however, designated differently in accordance with its function to be emphasized. More specifically, the adhesive 34 bonds the metal plate 36 and the semiconductor chip 30, and on the other hand, the insulating resin 34 protects the semiconductor chip 30 from external shock. The semiconductor chip 30 is protected from external shock by the metal plate 36 and the insulating resin 34.

With the semiconductor device 100 according to the first embodiment, the conductive pin is inserted into the recessed portion 12 through the opening 22, whereby the semiconductor device 100 is electrically coupled with other semiconductor devices or an interposer.

Figure 7A:
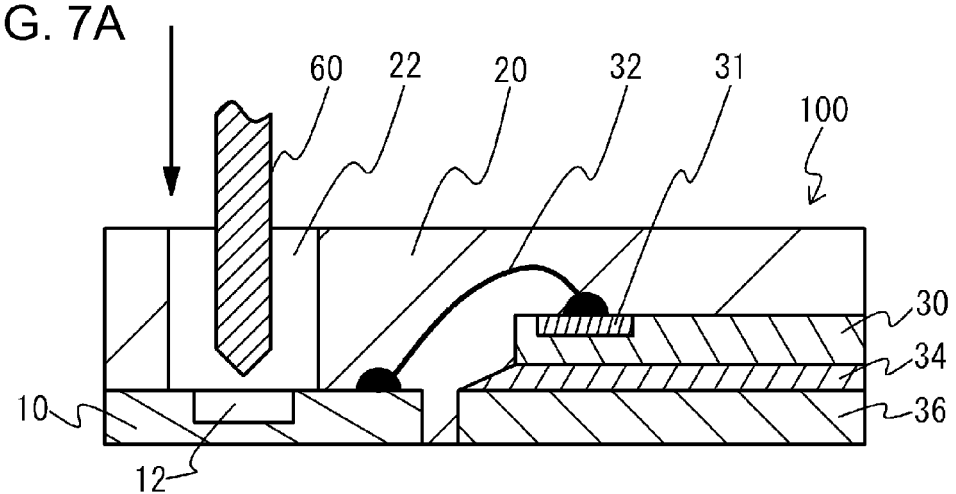
FIG. 7A is e cross-sectional view of the conductive pin in a semiconductor device according to the first embodiment.
Figure 7B:
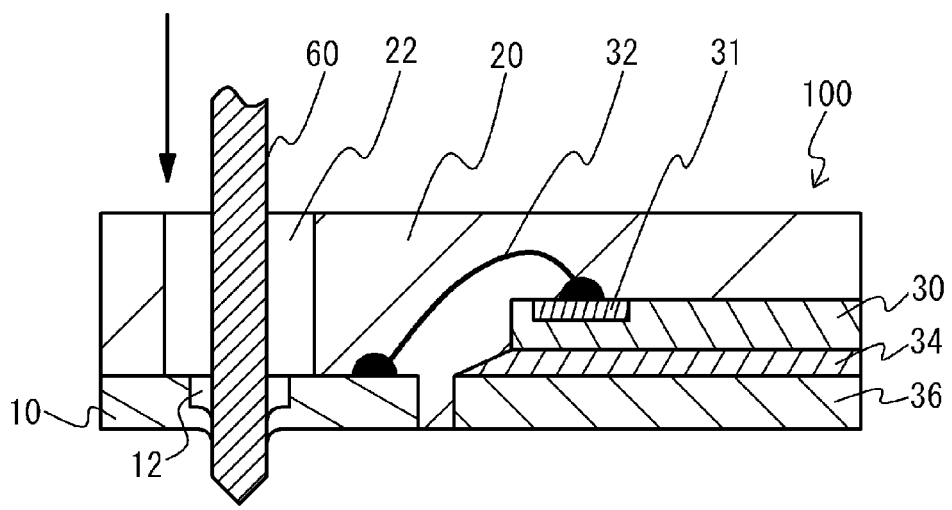
FIG. 7B is e cross-sectional view of the conductive pin penetrating a recessed portion in a semiconductor device according to the first embodiment.

FIG. 7A and FIG. 7B are cross-sectional views enlarging a part of the semiconductor device 100 according to the first embodiment. With reference to FIG. 7A, the conductive pin 60 made of, for example, copper, is vertically lowered from above the opening 22 towards the recessed portion 12. The conductive pin is, for example, a cylindrical shape with a diameter of 300 μm, and the tip thereof is sharp and acute. The diameter of the conductive pin 60 is smaller than the diameter of the opening 22. The conductive pin reaches the recessed portion 12 without contacting the resin section 20. Next, with reference to FIG. 7B, the conductive pin 60 is made to penetrate through the recessed portion 12. The thickness of the lead frame 10 at the recessed portion 12 is smaller than other portions, whereby the conductive pin 60 can easily penetrate through the lead frame 10. A hole is formed in the recessed portion 12 of the lead frame 10, whereby the lead frame 10 warps towards the lower direction. Accordingly, the lead frame 10 and the conductive pin 60 contact each other at the recessed portion 12. The lead frame 10 and the conductive pin 60 are mechanically coupled to each other by a frictional force generated at the contacting portion, whereby the semiconductor device 100 and the conductive pin 60 are electrically coupled to each other by the lead frame 10. Further, by electrically coupling the conductive pin 60 with other semiconductor devices or an interposer in a similar manner, the semiconductor device 100 and other semiconductor devices or an interposer can be electrically coupled to each other via the conductive pin 60. Details thereof are described later in a seventh embodiment of the present invention.

As described above, in the semiconductor device having a package-on-package structure that couples the semiconductor devices by the solder ball, in some cases, the semiconductor devices are deformed by heat, thereby not being able to perform coupling appropriately. On the other hand, in the semiconductor device 100 according to the first embodiment, by using the conductive pin, mechanical and electrical coupling can be performed at room temperature. Thus, a plurality of semiconductor devices can be stably stacked without deforming the semiconductor device by heat. Further, yield in manufacturing process of the semiconductor device can be increased by the above-described effect, whereby the density of the semiconductor devices can be increased.

Further, as shown in FIG. 7B, by only inserting the conductive pin 60 into the recessed portion 12 through the opening 22, the conductive pin 60 and the lead frame 10 can be mechanically and electrically coupled to each other. Accordingly, the materials used for manufacturing or processing can be reduced, thereby achieving cost reduction.

In FIG. 6A, although the shape of the recessed portion 12 viewed from above (hereinafter, planar shape) is rectangular, the planar shape of the recessed portion 12 is not limited to this, and may have other shapes (such as circular and hexagonal). To insert the conductive pin 60 more easily, the area of the planar shape of the recessed portion 12 is preferable to be smaller than the cross-sectional area of the conductive pin 60. Also, the thickness of the lead frame 10 at the recessed portion 12 is preferable to be not over the thickness in which the conductive pin can easily penetrate through, and more specifically, the thickness is preferable to be 50 µm or less.

In FIG. 6A, although the shape of the opening 22 viewed from above (hereinafter, planar shape) is rectangular, the planar shape of the opening 22 is not limited to this, and may be other shapes as long as the recessed portion 12 is exposed to the outside through the opening 22. In order to perform the resin molding in FIG. 4B easily, the area of the planar shape of the opening 22 is preferable to be larger than the area of the planar shape of the recessed portion 12. Also, the opening 22 in FIG. 6B forms an inner wall surface perpendicular with respect to the lead frame 10, the opening 22 may be formed so as to be larger from the upper surface towards the lower surface, or so as to be smaller from the upper surface towards the lower surface. Also, although the recessed portion 12 in FIG. 6A and FIG. 6B remains completely uncovered by the resin section 20, the recessed portion 12 may have different structures as long as at least a part thereof is exposed to the outside through the resin section 20. Accordingly, the conductive pin 60 can be inserted into the recessed portion 12 without contacting the resin section 20.

Second Embodiment

Figure 8A:
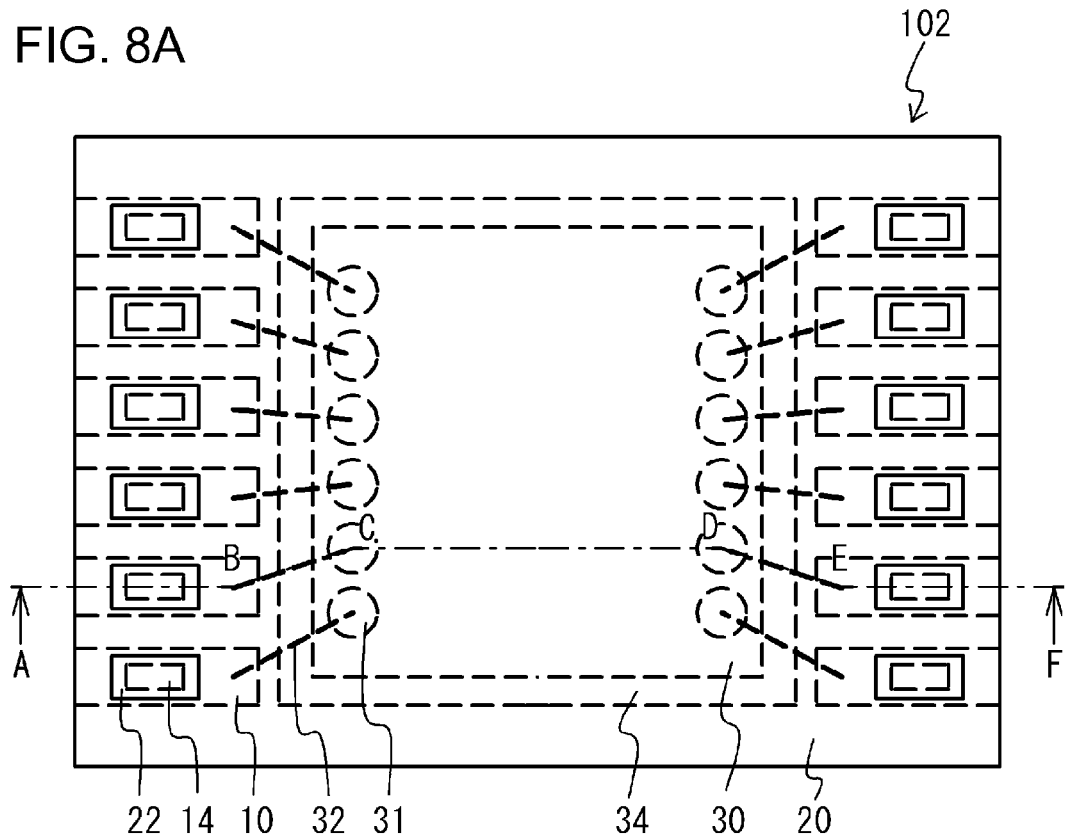
FIG. 8A is a top view of a semiconductor device according to a second embodiment of the present invention.
Figure 8B:
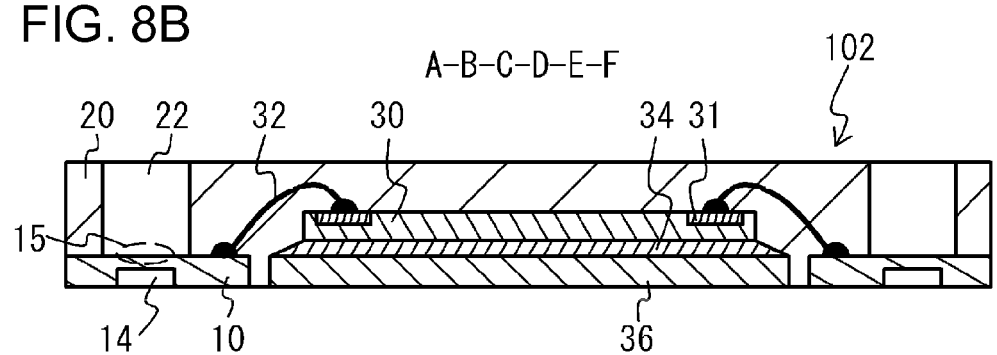
FIG. 8B is a cross-sectional view of a semiconductor device taken along the line A-F in FIG. 8A.

A second embodiment of the present invention is an exemplary semiconductor device provided with a recessed portion on a lower surface of a lead frame. FIG. 8A is a top view of a semiconductor device 102 according to the second embodiment, and FIG. 8B is a cross-sectional view taken along the line A-B-C-D-E-F of FIG. 8A. A recessed portion 14 is provided on the lower surface of the lead frame 10. The resin section 20 molds the lead frame 10 and the upper surface of the semiconductor chip 30. The opening 22 is provided above the recessed portion 14. A region 15 at the upper surface of the lead frame 10 that corresponds to (that is on the under side of) the recessed portion 14 is exposed to the outside through the opening 22. Other structures correspond to similarly numbered structures of the first embodiment (FIG. 6A and FIG. 6B).

With the semiconductor device 102 according to the second embodiment, by inserting the conductive pin 60 into the region 15 through the opening 22, the lead frame 10 and the conductive pin 60 can be mechanically and electrically coupled to each other. Accordingly, as in the first embodiment, the semiconductor device 102 can be mechanically and electrically coupled to other semiconductor devices and an interposer.

In one embodiment of the semiconductor device 102, the recessed portion 14 is provided on the lower surface of the lead frame 10. Accordingly, in the process of forming the resin section 20 (see FIG. 4B), the sealant 56 is not filled in the lower surface of the lead frame 10, whereby the sealant 56 is prevented from filling the recessed portion 14. Since the resin section 20 is less likely to be formed in the recessed portion 14, the conductive pin 60 can penetrate through the lead frame 10 more easily than with other configurations.

As in the first and second embodiments, the recessed portion 12 may be formed on at least one of the upper surface or the lower surface of the lead frame 10. Further, a structure having the recessed portion 12 provided on both the upper surface and the lower surface of the lead frame 10 may also be used.

Third Embodiment

Figure 9A:
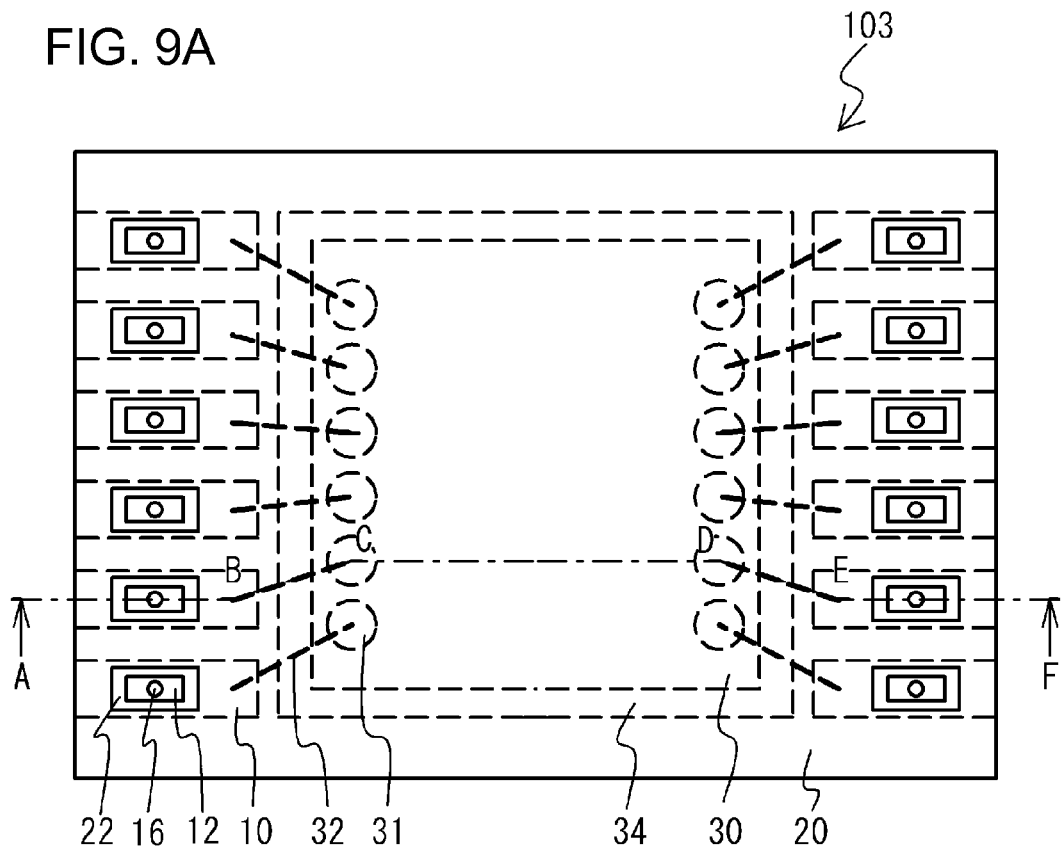
FIG. 9A is a top view of a semiconductor device according to a third embodiment of the present invention.
Figure 9B:
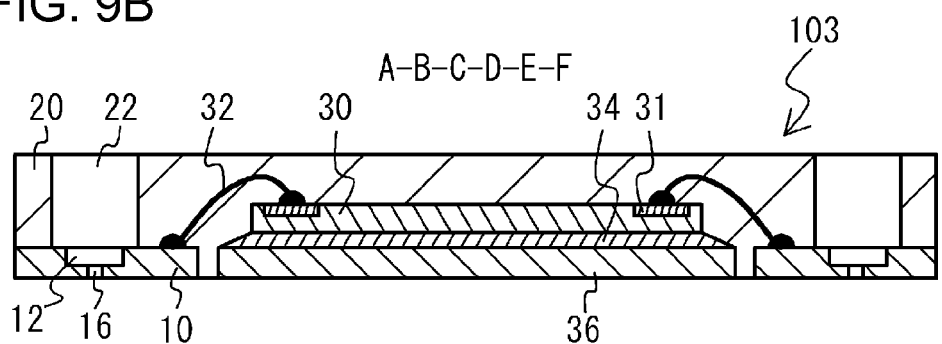
FIG. 9B is a cross-sectional view of a semiconductor device taken along the line A-F in FIG. 9A.

A third embodiment of the present invention is an exemplary semiconductor device provided with a through hole in a part of a recessed portion. FIG. 9A is a top view of a semiconductor device 103 according to the third embodiment. FIG. 9B is a cross-sectional view taken along the line A-B-C-D-E-F of FIG. 9A. The recessed portion 12 is provided with a hole 16 that penetrates through the lead frame 10. Other structures are the same as those of the first embodiment (FIG. 6).

According to the semiconductor device 103 of the third embodiment, the recessed portion 12 is provided with the hole 16 that penetrates through the lead frame 10. Accordingly, compared to the semiconductor device 100 discussed in the first described embodiment, the conductive pin 60 (see FIG. 7) can penetrate through the lead frame 10 with greater ease. Further, the hole 16 can be used as a marker for positioning when inserting the conductive pin 60, whereby the conductive pin 60 can be inserted with greater accuracy.

In FIG. 9A, although the shape of the hole 16 viewed from above (hereinafter, planar shape) is circular, the planar shape of the hole 16 is not limited to this, and may be other shapes (for example, rectangular). By inserting the conductive pin 60 into the hole 16, the conductive pin 60 and the lead frame 10 are electrically coupled to each other. According to this, the area of the planar shape of the hole 16 is preferable to be smaller than the cross-sectional area of the conductive pin 60. Further, although the semiconductor device 103 according to the third embodiment has a structure in which the hole 16 is provided in the recessed portion 12 of the semiconductor device 100 according to the first embodiment, a structure in which the hole 16 is provide in the recessed portion 14 of the semiconductor device 102 according to the second embodiment may be adopted.

Fourth Embodiment

Figure 10:
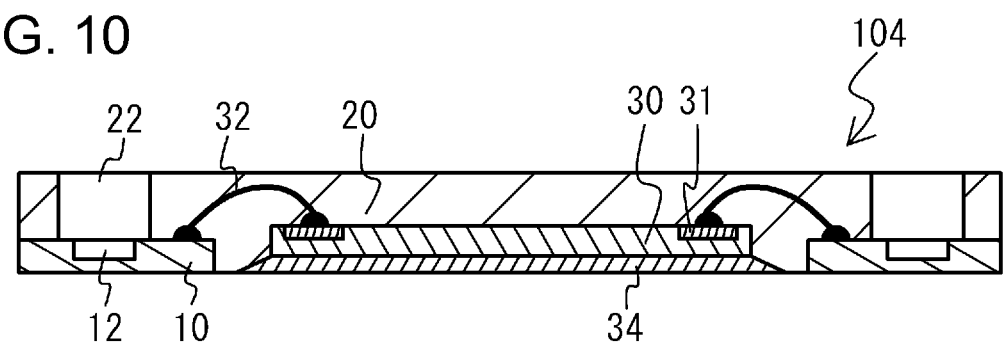
FIG. 10 is a cross-sectional view of a semiconductor device according to a fourth embodiment of the present invention.

A fourth embodiment of the present invention is an exemplary semiconductor device wherein a metal plate is removed from the semiconductor device according to the first embodiment. FIG. 10 is a cross-sectional view of a semiconductor device 104 according to the fourth embodiment. The semiconductor chip 30 is mounted on an upper surface of the insulating resin 34. The lower surface of the insulating resin 34 is exposed to the outside. That is, the lower surface of the semiconductor chip 30 is covered by the insulating resin 34, and the lower surface of the insulating resin 34 remains uncovered by the resin section 20. Other structures correspond to similarly designated structures provided in the description of the first embodiment (FIG. 6A and FIG. 6B).

In the semiconductor device 104 according to the fourth embodiment, since the metal plate 36 is not used as a support for the semiconductor chip 30, the height of the semiconductor device 104 can be lowered as much as the height of the metal plate 36. Also, by not using the metal plate 36, manufacturing cost can be reduced. Although the semiconductor device 104 according to the fourth embodiment has a structure in which the metal plate 36 is removed from the semiconductor device 100 according to the first embodiment, a structure in which the metal plate 36 is removed from the semiconductor devices 102 or 103 according to the second embodiment or the third embodiment may be adopted.

Fifth Embodiment

Figure 11:
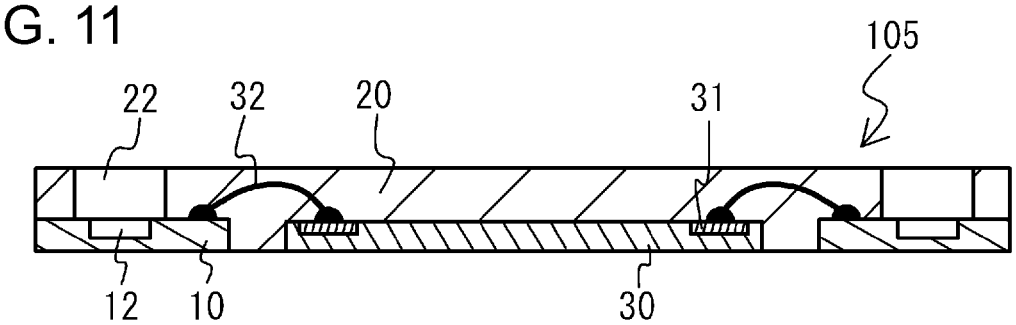
FIG. 11 is a cross-sectional view of a semiconductor device according to a fifth embodiment of the present invention.

A fifth embodiment of the present invention is an exemplary semiconductor device wherein a metal plate and an insulating resin are removed from the semiconductor device according to the first embodiment. FIG. 11 is a cross-sectional view of a semiconductor device 105 according to the fifth embodiment. The semiconductor chip 30 is molded with the resin section 20. The lower surface of the semiconductor chip 30 remains uncovered by the resin section 20. Other structures correspond to similarly designated structures provided in the description of the first embodiment (FIG. 6A and FIG. 6B).

In a semiconductor device 105 according to the fifth embodiment, since the metal plate 36 and the adhesive 34 (insulating resin 34) are not used as a support for the semiconductor chip 30, the height of the semiconductor device 105 can be lowered as much as the height of the metal plate 36 and the adhesive 34 (insulating resin 34). Moreover, by not using the metal plate 36 and the adhesive 34, manufacturing costs can be reduced. Furthermore, since the lower surface of the semiconductor chip 30 is exposed to the outside, the heat of the semiconductor chip 30 can be efficiently released to the outside.

Although the semiconductor device 105 according to the fifth embodiment includes a structure in which the metal plate 36 and the adhesive 34 are removed from the semiconductor device 100 according to the first embodiment, a structure in which the metal plate 36 and the adhesive 34 are removed from the semiconductor devices 102 or 103 according to the second embodiment or the third embodiment may be adopted.

Sixth Embodiment

Figure 12:
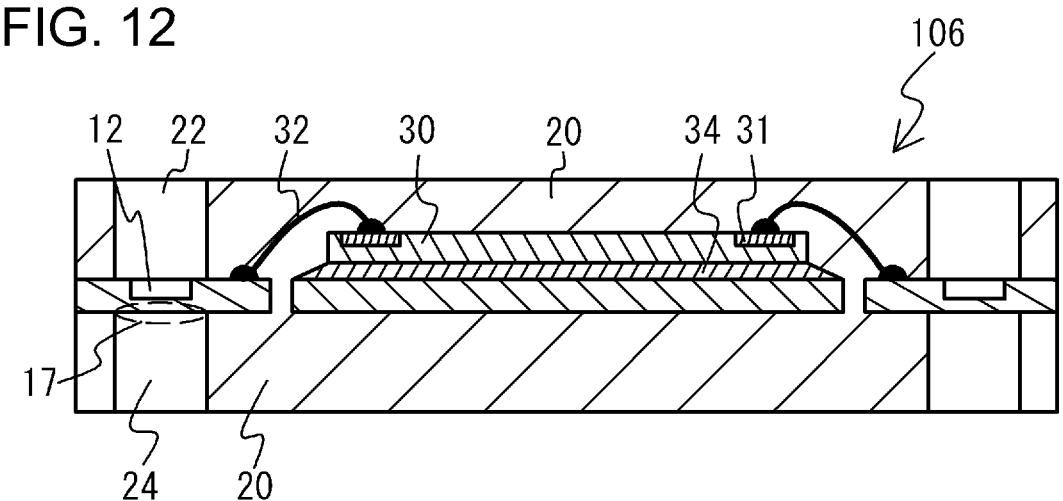
FIG. 12 is a cross-sectional view of a semiconductor device according to a sixth embodiment of the present invention.

A sixth embodiment is an example where a resin section is provided on both sides of the lead frame of the semiconductor device according to the first embodiment. FIG. 12 is a cross-sectional view of a semiconductor device 106 according to the sixth embodiment. Both sides of the semiconductor chip 30 and the lead frame 10 are molded with the resin section 20. That is, the resin section 20 is formed on the upper surface and the lower surface of the lead frame 10. In the resin section 20, the opening 22 is provided above the recessed portion 12, and the opening 24 is provided below the recessed portion 12. The recessed portion 12 is exposed to the outside through the opening 22. Further, a region 17 at the lower surface of the lead frame 10 that corresponds to the recessed portion 12 is exposed to the outside through the opening 24. Other structures correspond to similarly designated structures provided in the description of the first embodiment (FIG. 6A and FIG. 6B).

Figure 13:
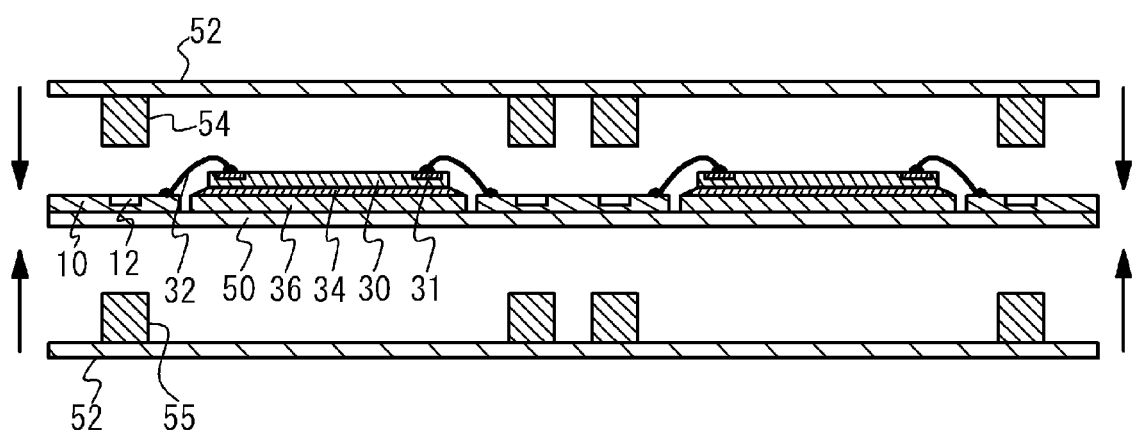
FIG. 13 is a drawing showing a process for manufacturing the semiconductor device according to the sixth embodiment.

FIG. 13 is a drawing depicting a method for manufacturing a semiconductor device according to the sixth embodiment, and corresponds to FIG. 4A of the first embodiment. Unlike FIG. 4A, the lead frame 10 is sandwiched by the mold 52 from above and below, wherein the resin section 20 is formed. Here, a clamp pin 55 is provided on the mold 52 for the lower surface of the lead frame 10. The clamp pin 55 is positioned below the recessed portion 12 (region 17), and when viewed from above, the area of the clamp pin 55 may be larger than the area of the recessed portion 12. In the process of forming the resin section 20, since the clamp pin 55 covers a lower surface of the recessed portion 12 (region 17), the resin section 20 is not formed in a portion where the clamp pin 55 exists. According to the above processes, with reference to FIG. 12, the opening 24 is formed below the region 17 of the resin section 20.

With the semiconductor device 106 according to the sixth embodiment, the conductive pin 60 can be inserted into the recessed portion 12 through the opening 22, whereby the conductive pin 60 and the lead frame 10 can be electrically coupled to each other. Also, the conductive pin 60 inserted into the recessed portion 12 protrudes to the outside from the region 17 through the opening 24, and are electrically coupled to other semiconductor devices or an interposer. Accordingly, the semiconductor device 106 can be electrically coupled to other semiconductor devices or interposers.

In one embodiment, a semiconductor device 106 according to the sixth embodiment has the resin section 20 formed on both sides of the lead frame 10. Accordingly, the thickness of the semiconductor device 106 becomes larger, whereby deformation of the semiconductor device 106 due to external force can be suppressed.

Although the semiconductor device 106 is depicted as having a structure in which the resin section 20 is provided on both sides of the semiconductor device 100 according to the first embodiment, a structure in which the resin section 20 is provided on both sides of the semiconductor devices 102 to 105 according to the second embodiment to the fifth embodiment may be adopted. Every such structure has the same structure except that the resin section 20 and the opening 24 are provided on the lower surface of the lead frame 10.

Seventh Embodiment

Figure 14A:
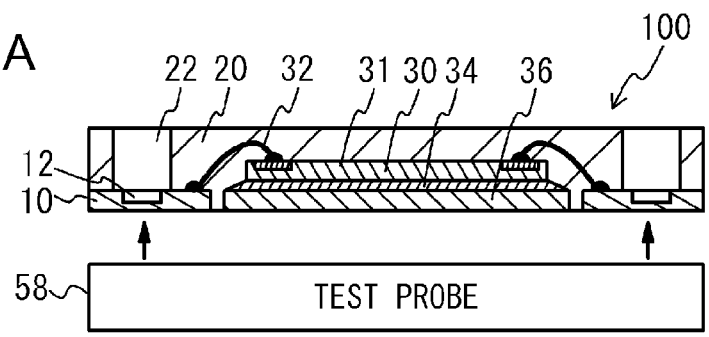
FIG. 14A depicts coupling a test electrode to a semiconductor device in a method for manufacturing a semiconductor device according to a seventh embodiment of the present invention.
Figure 14B:
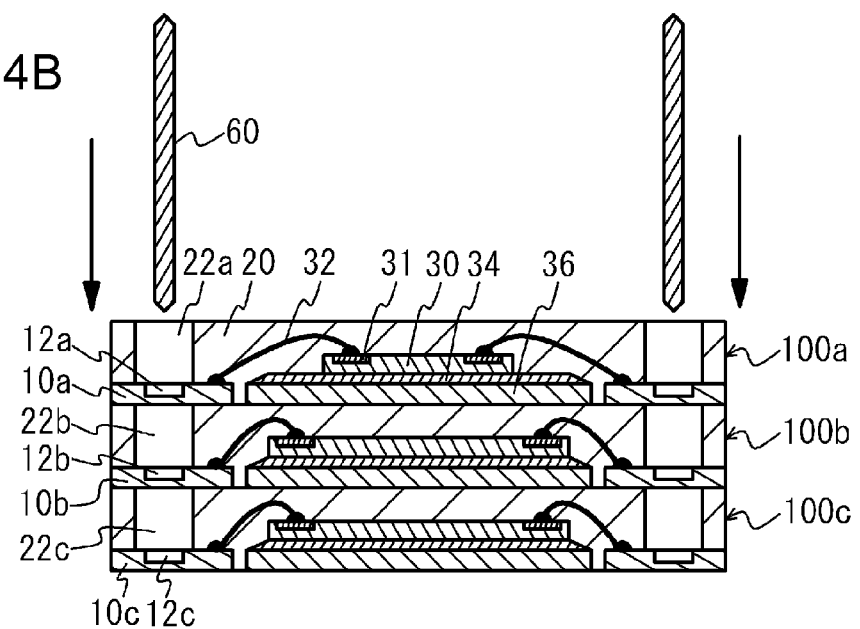
FIG. 14B depicts a stacking of semiconductor devices in a method for manufacturing a semiconductor device according to a seventh embodiment of the present invention.
Figure 14C:
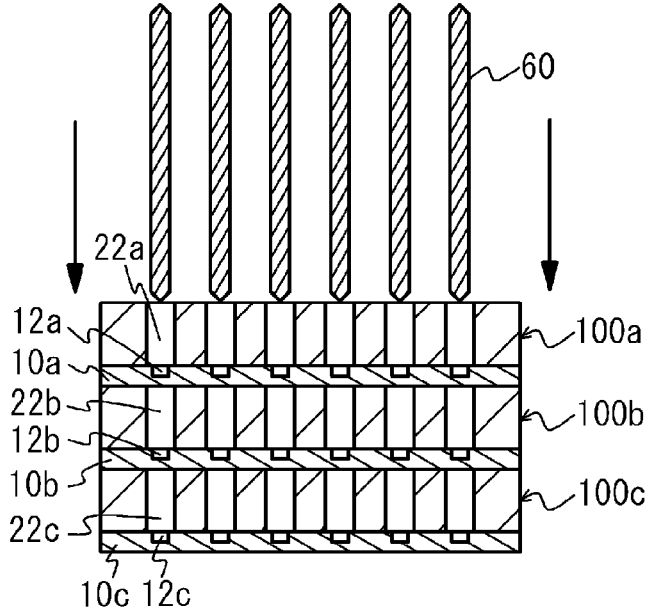
FIG. 14C depicts a lateral view of stacking semiconductor devices in a method for manufacturing a semiconductor device according to a seventh embodiment of the present invention.

The seventh embodiment is an exemplary configuration comprising more than one semiconductor device 100 according to the first embodiment is stacked and electrically coupled to each other by the conductive pin. With reference to FIG. 14A to FIG. 14C, a method for manufacturing the semiconductor device 107 according to the seventh embodiment will be described.

FIG. 14A and FIG. 14B are drawings showing the method for manufacturing the semiconductor device 107 according to the seventh embodiment. FIG. 14C is a drawing of the FIG. 14B viewed from a lateral direction. With reference to FIG. 14A, a test electrode 58 is coupled to the semiconductor device 100 according to the first embodiment, whereby a test for confirming electrical conduction is performed. According to this, non-defectives and defectives are separated. With reference to FIG. 14B and FIG. 14C, semiconductor devices 100a to 100c (determined as non-defectives in the test for confirming conduction) are stacked, and the conductive pin 60 is inserted from above. The conductive pin 60 is inserted through an opening 22a, penetrates through a lead frame 10a at a recessed portion 12a, and is coupled to the semiconductor device 100a. Consequently, the conductive pin 60 is inserted further downward, whereby the conductive pin 60 is coupled to the semiconductor device 100b at a recessed portion 12b and the semiconductor device 100c at a recessed portion 12c. The conductive pin 60 that penetrates through a lead frame 10c projects from a lower surface of the semiconductor device 100c. According to the above processes, manufacture of a semiconductor device 107 according to the seventh embodiment is performed.

Figure 15:
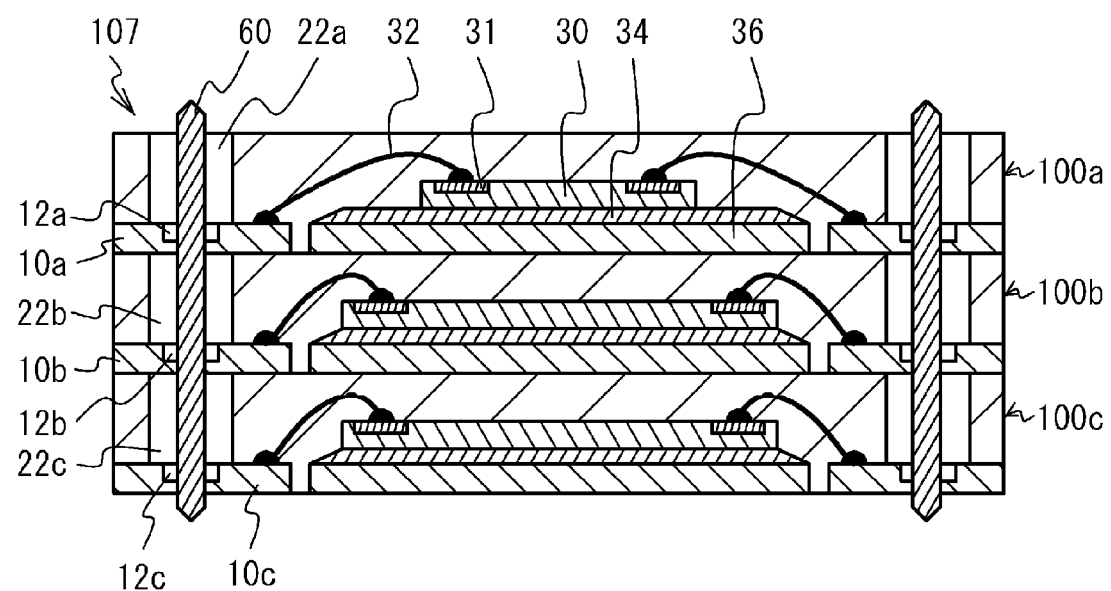
FIG. 15 is a cross-sectional view of the semiconductor device according to the seventh embodiment.

FIG. 15 is a cross-sectional view depicting a structure of the semiconductor device 107 according to the seventh embodiment. The semiconductor devices 100a to 100c according to the first embodiment are stacked, and are fixed by the conductive pin 60. The conductive pin 60 penetrates through the opening 22a, the recessed portion 12a, an opening 22b, the recessed portion 12b, an opening 22c, and the recessed portion 12c, and projects from a lower surface of the semiconductor device 107. The semiconductor device 100a is electrically coupled to the conductive pin 60 by the lead frame 10a. Similarly, the semiconductor device 100b is electrically coupled to the conductive pin 60 by a lead frame 10b and the semiconductor device 100c by the lead frame 10c. Accordingly, the semiconductor devices 100a to 100c are mechanically fixed by the conductive pin 60, and are electrically coupled to each other via the conductive pin 60.

As described above, in the semiconductor device having a package-on-package structure that couples the semiconductor devices by the solder ball, the semiconductor devices deform due to heat, whereby appropriate coupling could not be performed in some cases. On the other hand, in the semiconductor device 107 according to the seventh embodiment, the plurality of semiconductor devices 100a to 100c are electrically coupled to each other by the conductive pin 60. Since the process of coupling the semiconductor devices 100a to 100c by the conductive pin 60 can be performed at a room temperature, the semiconductor devices 100a to 100c are not deformed by heat. Accordingly, yield in manufacturing processes for the semiconductor device 107 can be improved, whereby the density of the semiconductor devices can be increased.

Also, since the semiconductor devices 100a to 100c are fixed by the conductive pin 60, the semiconductor devices 100a to 100c can be removed even after the semiconductor device 107 has been assembled. Accordingly, after assembling the semiconductor device 107, the test for confirming conduction can be performed and only defective packages can be discarded. For example, in a case where only the semiconductor device 100b is determined as defective among the semiconductor devices 100a to 100c, only the semiconductor device 100b is discarded, and the semiconductor devices 100a and 100c can be reused as non-defectives. Accordingly, even in a case when defectives occur after assembling the semiconductor device 107, only minimum parts need to be exchanged, whereby manufacturing costs can be reduced.

In alternate embodiments, conductive pin 60 may be implemented other than the embodiment shown in FIG. 7 as long as the conductive pin 60 penetrates through the lead frame 10 and mechanically and electrically couples the plurality of semiconductor devices 100 to each other. In some embodiments, the cross-section of the conductive pin 60 may be preferable to have a diameter of 300 μm or more if circular, and a side length of 300 μm or more if rectangular. Also, a cross-sectional shape of the tip of the conductive pin 60 may be preferable to be an acute triangle. Accordingly, the conductive pin 60 can penetrate through the lead frame 10.

In FIG. 15, although the semiconductor device 107 according to the seventh embodiment includes the stacked semiconductor devices 100 according to the first embodiment, the semiconductor devices 102 to 106 according to the second embodiment to the sixth embodiment may be adopted. Also, among these semiconductor devices, any of the semiconductor devices may be combined and stacked. Further, although the number of the semiconductor devices stacked in FIG. 15 is three, the number of semiconductor devices to be stacked is not limited to this, and two or four or more semiconductor devices may be stacked.

Eighth Embodiment

Figure 16:
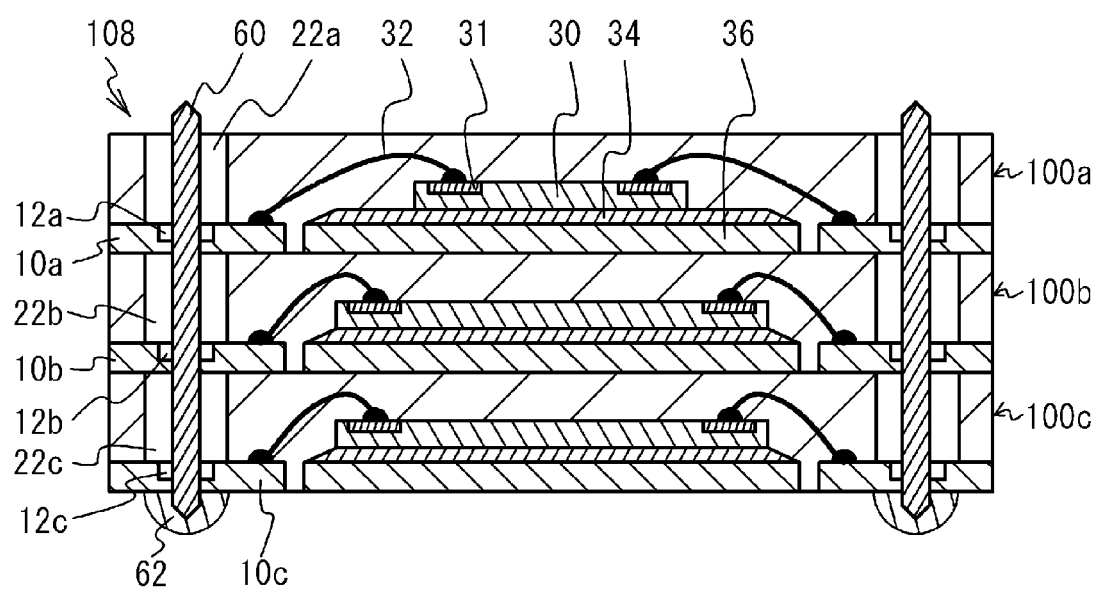
FIG. 16 is a cross-sectional view of a semiconductor device according to an eighth embodiment of the present invention.

An eighth embodiment of the present invention is an exemplary semiconductor device providing a solder ball on the tip of the conductive pin of the semiconductor device according to the seventh embodiment. FIG. 16 is a cross-sectional view showing a structure of a semiconductor device 108 according to the eighth embodiment. On a lower end of the conductive pin 60, a solder ball 62 made of, for example, tin, silver, and copper, is provided. Other structures correspond to similarly designated structures provided in the description of the seventh embodiment.

In a semiconductor device 108 according to the eighth embodiment, by melting and solidifying the solder ball 62 to bond the solder ball 62 to an electrode provided on the interposer, the semiconductor device 108 can be fixed to the interposer, whereby the semiconductor device 108 and the interposer can be electrically coupled to each other. Similarly, other than on the interposer, the semiconductor device 108 can be mounted by melting and solidifying the solder ball 62 on to the mounting section having a function of mounting the semiconductor device 108.

Ninth Embodiment

Figure 17:
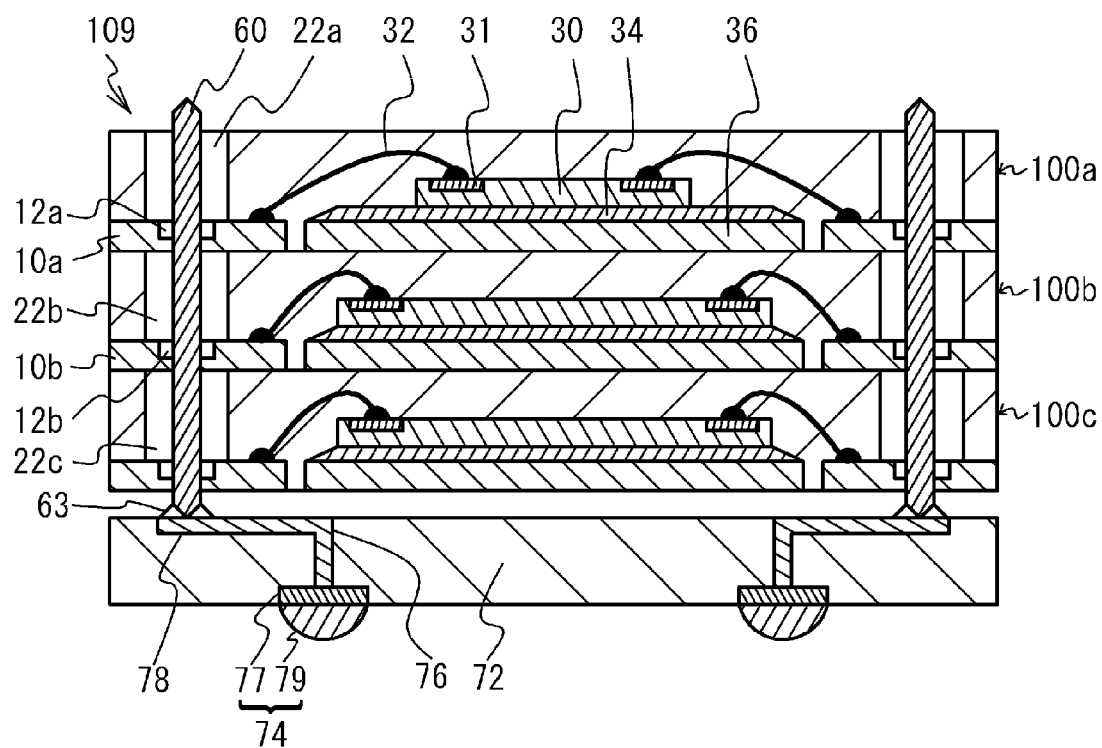
FIG. 17 is a cross-sectional view of a semiconductor device according to a ninth embodiment of the present invention.

A ninth embodiment of the present invention is an exemplary method of mounting the semiconductor device according to the eighth embodiment on an interposer. FIG. 17 is a cross-sectional view showing a structure of a semiconductor device 109 according to the ninth embodiment. The semiconductor device 108 according to the eighth embodiment is mounted on an upper surface of an interposer 72 by a solder 63 that is the solder ball 62 (see FIG. 16) melted and solidified. On a lower surface of the interposer 72, an external coupling terminal 74 for electrically coupling with the outside is provided. The external coupling terminal 74 is composed of an electrode pad 77 and a solder ball 79 provided on a surface of the electrode pad 77. The solder 63 and the electrode pad 77 (external coupling terminal 74) are electrically coupled to each other by a redistribution layer 78 that runs through a through hole 76 provided in the interposer 72.

The electrode pad 77 and the solder ball 79 (that is, the external coupling terminal 74) can be provided in any position by being aligned to a position of a coupling terminal of a mounting portion on which the semiconductor device 109 is mounted. Also, configuration of the redistribution layer 78 is not limited to the one shown in FIG. 17 as long as the solder 63 is electrically coupled to the external coupling terminal 74. For example, the redistribution layer 78 may have a structure that runs through a side face of the interposer 72, not the structure that runs through the through hole 76. The redistribution layer 78 may use metals such as copper and aluminum.

In the semiconductor device 109 according to the ninth embodiment, the external coupling terminal 74 can be provided by being aligned to the position of the coupling terminal of the mounting portion on which the semiconductor device 109 is mounted. Accordingly, even in a case where the position of the solder ball of the semiconductor device 108 according to the eighth embodiment is not aligned to the position of the coupling terminal of the mounting portion, the semiconductor device 108 can be mounted on any mounting portion via the interposer 72.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A semiconductor device comprising:
   a semiconductor chip;
   a lead frame, electrically coupled to the semiconductor chip, the lead frame provided with a recessed portion on a surface of the lead frame, wherein a hole is provided in a part of the recessed portion; and
   a resin section that molds the semiconductor chip and the lead frame, the resin section provided with an opening above the recessed portion of the lead frame, wherein the opening and the recessed portion comprise wholly unfilled space defined by sidewalls in the resin section and sidewalls in the recessed portion respectively that surround without contacting a conductive pin wherein the hole and the recessed portion are in the lead frame, and the opening is in the resin section, wherein from a plan perspective the opening and the recessed portion are rectangular in shape and the hole is circular in shape wherein the opening has the greatest width and the hole the smallest width.

2. The semiconductor device according to claim 1, wherein the recessed portion is provided on an upper surface of the lead frame.

3. The semiconductor device according to claim 1, wherein the recessed portion is provided on a lower surface of the lead frame.

4. The semiconductor device according to claim 1, wherein the hole penetrates through the lead frame.

5. The semiconductor device according to claim 1, wherein a lower surface of the semiconductor chip is not covered by the resin section.

6. The semiconductor device according to claim 1, wherein the resin section is formed on an upper surface of the lead frame and a lower surface of the lead frame, and the resin section is provided with an opening above and below the recessed portion.

7. A device comprising:
   a plurality of semiconductor devices, a semiconductor device comprising:
      a semiconductor chip;
      a lead frame, electrically coupled to the semiconductor chip, the lead frame provided with a recessed portion on a surface of the lead frame and a hole in a part of the recessed portion; and
      a resin section that molds the semiconductor chip and the lead frame, the resin section provided with an opening above the recessed portion of the lead frame; and
      a conductive pin, the conductive pin being inserted through the recessed portion provided on the lead frame and the opening provided in the resin section of the plurality of semiconductor devices, so as to electrically couple the plurality of semiconductor devices to each other, the recessed portion comprises unfilled space defined by sidewalls in the recessed portion that surround without contacting the conductive pin wherein from a plan perspective the opening and the recessed portion are rectangular in shape and the hole is circular in shape wherein the opening has the greatest width and the hole the smallest width.

8. A semiconductor device according to claim 7, further comprising:
   an interposer mounted with a first semiconductor device of the plurality of semiconductor devices;
   an external coupling terminal provided on a surface of the interposer that is opposite to a surface mounted to the first semiconductor device; and
   a redistribution layer electrically coupling the first semiconductor device and the external coupling terminal to each other.

9. A method of manufacturing a semiconductor device, the method comprising:
   stacking a plurality of semiconductor devices; and
   mechanically and electrically coupling the plurality of semiconductor devices to each other by a conductive pin being inserted through a recessed portion provided on a lead frame and an opening provided in a resin section of each of the plurality of semiconductor devices, the recessed portion comprises unfilled space defined by sidewalls in the recessed portion that surround without contacting the conductive pin wherein a hole and the recessed portion are in the lead frame and the opening is in the resin section wherein from a plan perspective the opening and the recessed portion are rectangular in shape and the hole is circular in shape wherein the opening has the greatest width and the hole the smallest width.

10. The method of manufacturing a semiconductor device according to claim 9, wherein a semiconductor device of the plurality of semiconductor devices is manufactured by steps comprising:
    forming the recessed portion on an upper surface or a lower surface of the lead frame;
    electrically coupling the lead frame and a semiconductor chip to each other; and
    forming the resin section to mold the lead frame and the semiconductor chip to form the opening above the recessed portion.

\* \* \* \* \*